(12) United States Patent
Wu

(10) Patent No.: US 9,124,971 B2
(45) Date of Patent: Sep. 1, 2015

(54) AUDIO SIGNAL PROCESSING CIRCUIT FOR REDUCING ZERO CROSSING DISTORTION AND METHOD THEREOF

(71) Applicant: Richtek Technology Corporation, Hsinchu County (TW)

(72) Inventor: Tsung-Nan Wu, Hsinchu County (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 220 days.

(21) Appl. No.: 13/965,518

(22) Filed: Aug. 13, 2013

(65) Prior Publication Data

US 2014/0046671 A1 Feb. 13, 2014

(30) Foreign Application Priority Data

Aug. 13, 2012 (TW) .............................. 101129275 A

(51) Int. Cl.
*H04R 5/00* (2006.01)
*H04R 5/04* (2006.01)
*G10L 19/00* (2013.01)
*H03F 3/217* (2006.01)

(52) U.S. Cl.
CPC ...... *H04R 5/04* (2013.01); *G10L 19/00* (2013.01); *H03F 3/217* (2013.01)

(58) Field of Classification Search
CPC ................................. G10L 25/09; H04R 5/04
USPC ..................................... 704/213, 500; 381/28
See application file for complete search history.

(56) References Cited

U.S. PATENT DOCUMENTS

| 4,949,048 A * | 8/1990 | Tokumo et al. ................. 330/10 |
| 5,068,661 A * | 11/1991 | Kaneaki et al. ............... 341/143 |
| 6,373,336 B1 | 4/2002 | Anderskouv et al. |
| 6,795,004 B2 * | 9/2004 | Masuda et al. ................ 341/143 |
| 2006/0262843 A1 * | 11/2006 | Kim et al. ..................... 375/238 |
| 2007/0201706 A1 * | 8/2007 | Yanai ............................ 381/117 |

* cited by examiner

*Primary Examiner* — Shaun Roberts
(74) *Attorney, Agent, or Firm* — Birch, Stewart, Kolasch & Birch, LLP

(57) ABSTRACT

An audio signal processing circuit includes an encoding circuit, a first audio conversion circuit, and a second audio conversion circuit. The encoding circuit receives pulse coded modulation signals and generates a first audio signal and a second audio signal accordingly. The first audio conversion circuit generates a first pulse width modulation (PWM) signal according to consecutive values of the first audio signal for configuring a first power stage circuit. The second audio conversion circuit generates a second PWM signal according to consecutive values of the second audio signal for configuring a second power stage circuit. The pulse width of the first PWM signal is configured to be substantially equal to the pulse width of the second PWM signal, and the pulse edges of the first PWM signal and the second PWM signal are configured to be separated by a predetermined time interval to mute the audio signal processing circuit.

14 Claims, 5 Drawing Sheets

AUDIO SIGNAL PROCESSING CIRCUIT FOR REDUCING ZERO CROSSING DISTORTION AND METHOD THEREOF

CROSS-REFERENCE TO RELATED APPLICATIONS

This application claims the benefit of priority to Patent Application No. 101129275, filed in Taiwan on Aug. 13, 2012; the entirety of which is incorporated herein by reference for all purposes.

BACKGROUND

The disclosure generally relates to an audio signal processing circuit and, more particularly, to the audio signal processing circuit for reducing the zero crossing distortion.

BD mode encoders are often utilized in the audio systems for performing audio signal processing operations so as to configure the load (e.g., a speaker) to generate the required sound. The BD mode encoder converts an audio signal into a corresponding inverted signal and a corresponding non-inverted signal to differentially represent the original audio signal. The inverted signal and the non-inverted signal are respectively modulated by the pulse width modulation (PWM) circuit to generate an inverted PWM signal and a non-inverted PWM signal. The inverted PWM signal and the non-inverted PWM signal are utilized to drive a full bridge power stage circuit so as to configure the speaker to generate the required sound. Some noise and even-order nonlinear signals may be eliminated by the BD mode encoder and not transmitted to the speaker. As a result, the audio system may generate good quality sounds.

The BD mode encoder, however, has the zero crossing distortion problem. Specifically, when the edge of the inverted PWM signal and the edge of the non-inverted PWM signal are too close, the circuits in the audio system are prone to generating noise and accordingly the speaker generates unpleasant sound. FIG. 1 shows an audio signal, the corresponding non-inverted PWM signal and the corresponding inverted PWM signal in the audio system. When the absolute value of the audio signal is larger, the difference between the pulse width of the inverted PWM signal and the pulse width of the non-inverted PWM signal is larger. Thus, the power stage circuit drives the speaker to generate a louder sound. When the absolute value of the audio signal is smaller, the difference between the pulse width of the inverted PWM signal and the pulse width of the non-inverted PWM signal is smaller. Thus, the power stage circuit drives the speaker to generate a smaller sound. For example, when the audio system is mute, the value of the audio signal is configured to be 0. The audio system generates an inverted PWM signal and a non-inverted PWM signal both of which have the same pulse width. In this situation, the edge of the pulse of the inverted PWM signal and the edge of the pulse of the non-inverted PWM signal are very close. As a result, the circuits in the audio system are prone to generating noise and accordingly the speaker generates unpleasant sound. Especially when the audio system is configured to generate a small sound or to be mute, the zero crossing distortion problem is more severe. Because the difference between the pulse width of the inverted PWM signal and the pulse of the non-inverted PWM signal is very small, the circuits in the audio system are prone to generating noise. Users are more likely to hear and be bothered by the unpleasant sound from the speaker when the audio system is configured to generate a small sounder or to be mute.

The approach disclosed in U.S. Pat. No. 6,373,336 utilizes a delay circuit in the audio system so as to delay one of the inverted PWM signal and the non-inverted PWM signal for a designated time interval. Accordingly, when the audio system is configured to generate a small sound or to be mute, the inverted PWM signal and the non-inverted PWM signal are separated by the designated time interval. Thus, the noise caused by the zero crossing distortion may be reduced.

In order to flexibly adjust the designated time interval in different audio systems or to avoid the inaccuracy of the designated time interval caused by the variation in manufacturing processes, complicated delay circuits and control circuits are necessary in the aforementioned audio systems. The complicated delay circuits, however, not only introduce additional noises and affect the performance of the audio system, but also increase the hardware design complexity and the production cost.

SUMMARY

An example embodiment of an audio signal processing circuit, configured to operably configure an audio output device through a first power stage circuit and a second power stage circuit, comprising: an encoding circuit, configured to operably receive a pulse coded modulation signal and to operably generate a first audio signal and a second audio signal according to the pulse coded modulation signal; a first audio conversion circuit, coupled with the encoding circuit, configured to operably generate a first pulse width modulation (PWM) signal to configure the first power stage circuit according to a first encoded value and a second encoded value of the first audio signal; and a second audio conversion circuit, coupled with the encoding circuit, configured to operably generate a second PWM signal to configure the second power stage circuit according to a third encoded value of the second audio signal, a fourth encoded value of the second audio signal and a displacement value; wherein the first encoded value and the second encoded value are consecutive in the first audio signal; the third encoded value, the fourth encoded value are consecutive in the second audio signal; when the first encoded value is equal to the third encoded value, and the second encoded value is equal to the fourth encoded value, a pulse width of a pulse of the first PWM signal is equal to a pulse width of a pulse of the second PWM signal, and an edge of the pulse of the first PWM signal and an edge of the pulse of the second PWM signal is separated by a predetermined time interval.

Another example embodiment of a method for processing audio signals, comprising: generating a first audio signal and a second audio signal according to a pulse coded modulation signal; generating a first PWM signal to configure a first power stage circuit according to a first encoded value and a second encoded value of the first audio signal; and generating a second PWM signal to configure the second power stage circuit according to a third encoded value of the second audio signal, a fourth encoded value of the second audio signal and a displacement value; wherein the first encoded value and the second encoded value are consecutive in the first audio signal; the third encoded value, the fourth encoded value are consecutive in the second audio signal; when the first encoded value is equal to the third encoded value, and the second encoded value is equal to the fourth encoded value, a pulse width of a pulse of the first PWM signal is equal to a pulse width of a pulse of the second PWM signal, and an edge of the pulse of the first PWM signal and an edge of the pulse of the second PWM signal is separated by a time interval.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
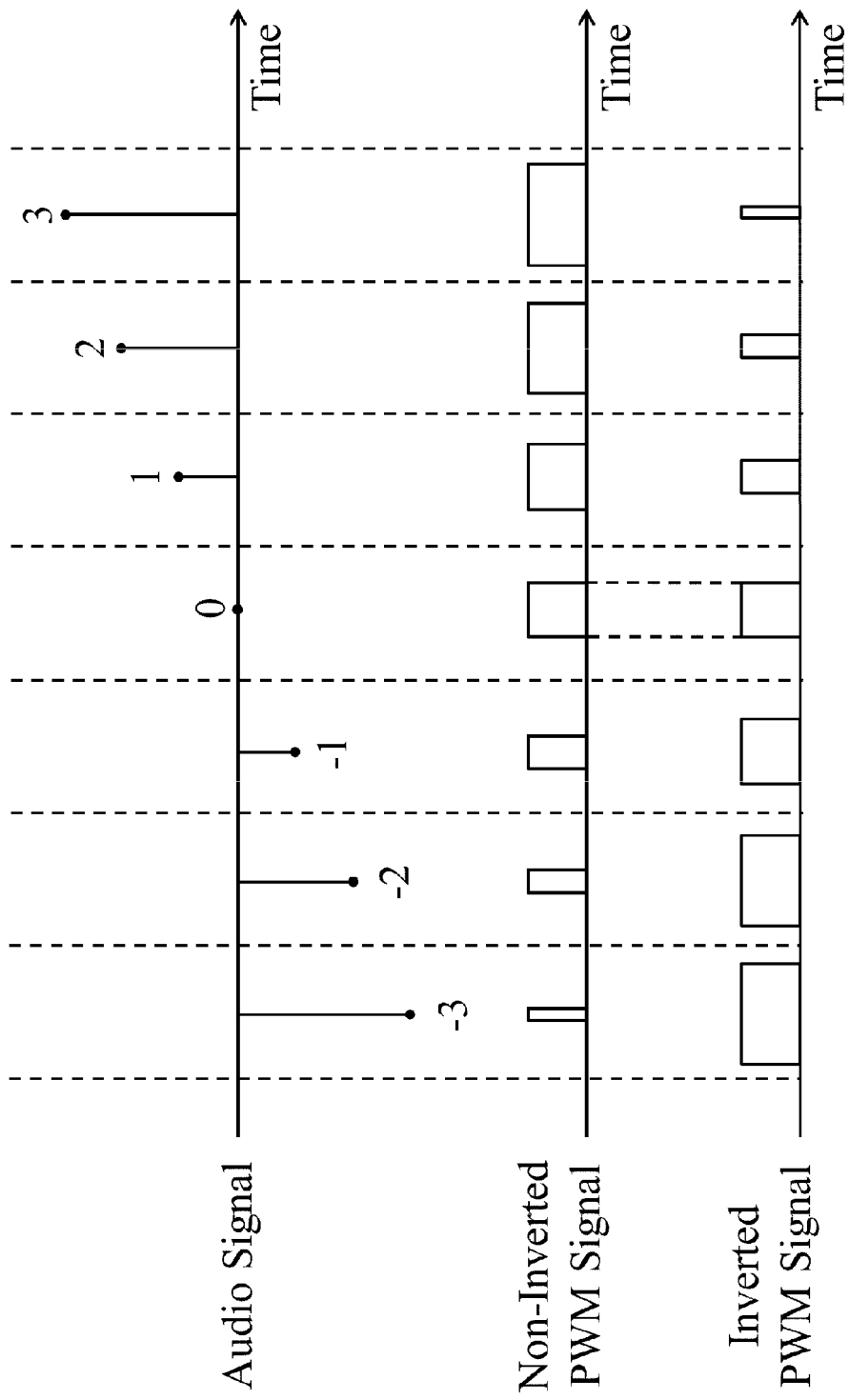
FIG. 1 shows a simplified timing diagram of audio signals in a conventional audio system.
Figure 2:
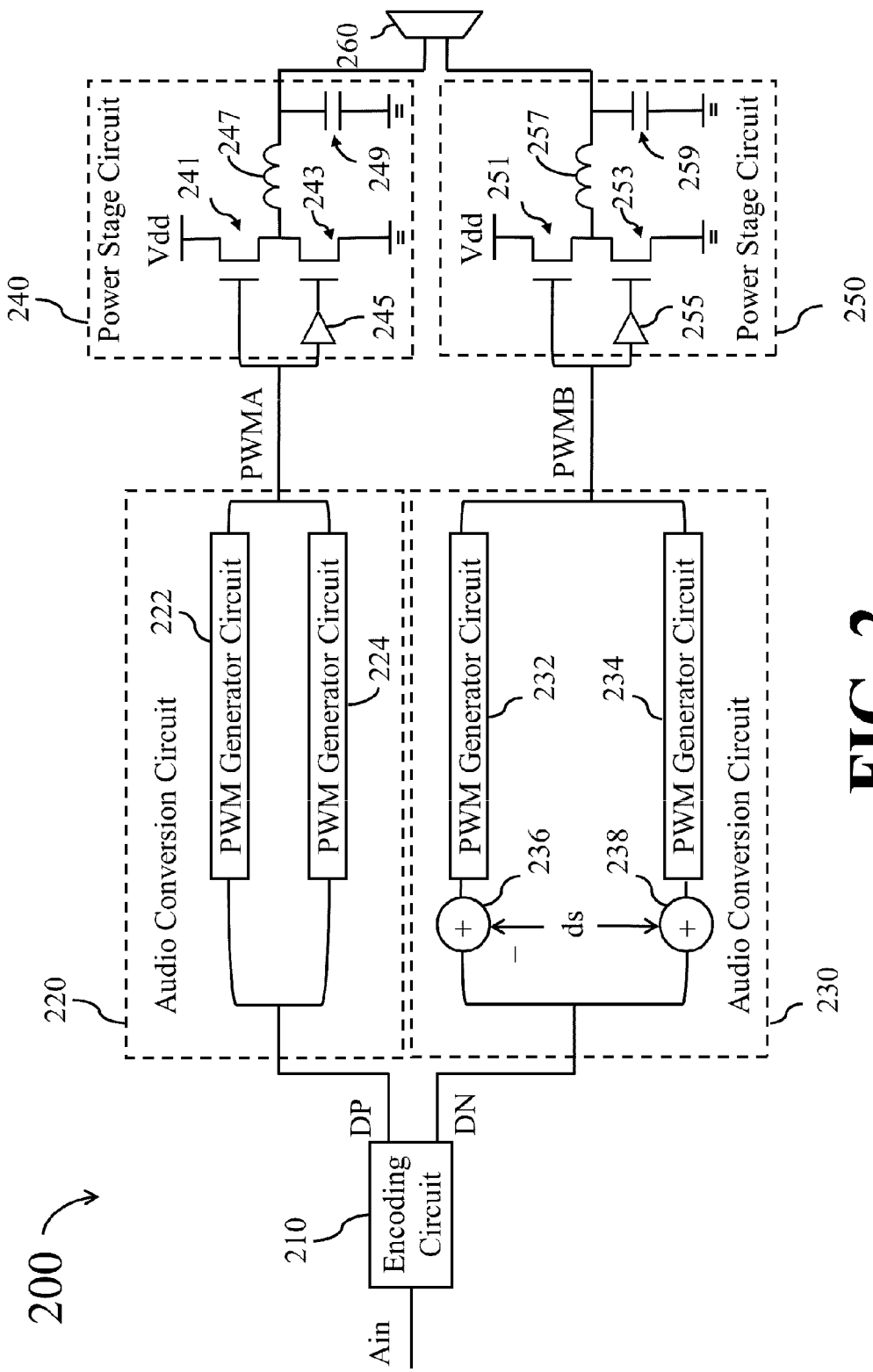
FIG. 2 shows a simplified functional block diagram of an audio signal processing circuit according to one embodiment of the present disclosure.

FIG. 2 shows a simplified functional block diagram of an audio signal processing circuit 200 according to one embodiment of the present disclosure. The audio signal processing circuit 200 comprises an encoding circuit 210, a first audio conversion circuit 220, a second audio conversion circuit 230, a first power stage circuit 240, and a second power stage circuit 250. The encoding circuit 210 is coupled with an input terminal of the first audio conversion circuit 220 and an input terminal of the second audio conversion circuit 230. Output terminals of the audio conversion circuits 220 and 230 are respectively coupled with input terminals of the first power stage circuit 240 and the second power stage circuit 250, and output terminals of the power stage circuits 240 and 250 are respectively coupled with input terminals of an audio output device 260. The audio signal processing circuit 200 generates the required sound at the audio output device 260 according to a received pulse coded modulation (PCM) signal Ain.

The PCM signal Ain may be a PCM signal generated by an audio chip of a computer, an audio chip of a mobile phone, or other suitable audio processing devices. In this embodiment, the encoding circuit 210 receives the PCM signal Ain for generating a first audio signal DP and a second audio signal DN correspondingly.

The first audio conversion circuit 220 comprises a first pulse width modulation (PWM) generating circuit 222 and a second PWM generating circuit 224. The first audio conversion circuit 220 is configured to operably receive the first audio signal DP generated by the encoding circuit 210, and converts the first audio signal DP to a first PWM signal PWMA for transmitting to the first power stage circuit 240.

The second audio conversion circuit 230 comprises a third PWM generating circuit 232, a fourth PWM generating circuit 234, a first adder circuit 236, and a second adder circuit 238. An output terminal of the first adder circuit 236 is coupled with an input terminal of the third PWM generating circuit 232. The first adder circuit 236 is configured to operably subtract a predetermined displacement value ds from the second audio signal DN generated by the encoding circuit 210. An output terminal of the second adder circuit 238 is coupled with an input terminal of the fourth PWM generating circuit 234. The second adder circuit 238 is configured to operably add the predetermined displacement value ds to the second audio signal DN generated by the encoding circuit 210. The second audio conversion circuit 230 is configured to operably receive the second audio signal DN generated by the encoding circuit 210, and converts the second audio signal DN to a second PWM signal PWMB for transmitting to the second power stage circuit 250.

The first power stage circuit 240 comprises a first transistor 241, a second transistor 243, a first inverting circuit 245, a first inductor 247, and a first capacitor 249. One terminal of the first transistor 241 is coupled with a power supply Vdd, and another terminal of the first transistor 241 is coupled with one terminal of the second transistor 243 and the first inductor 247. Another terminal of the second transistor 243 is coupled with the ground. The input terminal of the first power stage circuit 240 is coupled with a control terminal of the first transistor 241, and coupled with a control terminal of the second transistor 243 through the first inverting circuit 245. For example, the control terminal of the transistors 241 and 243 may be a gate terminal of a field-effect transistor or a base terminal of a bipolar junction transistor. The other terminal of the first inductor 247 is coupled with the first capacitor 249 and the audio output device 260.

The second power stage circuit 250 comprises a third transistor 251, a fourth transistor 253, a second inverting circuit 255, a second inductor 257, and a second capacitor 259. One terminal of the third transistor 251 is coupled with a power supply Vdd, and another terminal of the third transistor 251 is coupled with one terminal of the fourth transistor 253 and the second inductor 257. Another terminal of the fourth transistor 253 is coupled with the ground. The input terminal of the second power stage circuit 250 is coupled with a control terminal of the third transistor 251, and coupled with a control terminal of the fourth transistor 253 through the second inverting circuit 255. The other terminal of the second inductor 257 is coupled with the second capacitor 259 and the audio output device 260.

The audio output device 260 may be realized with a speaker or other suitable loads, and generate the required sound according to the output signals of the power stage circuits 240 and 250.

Figure 3:
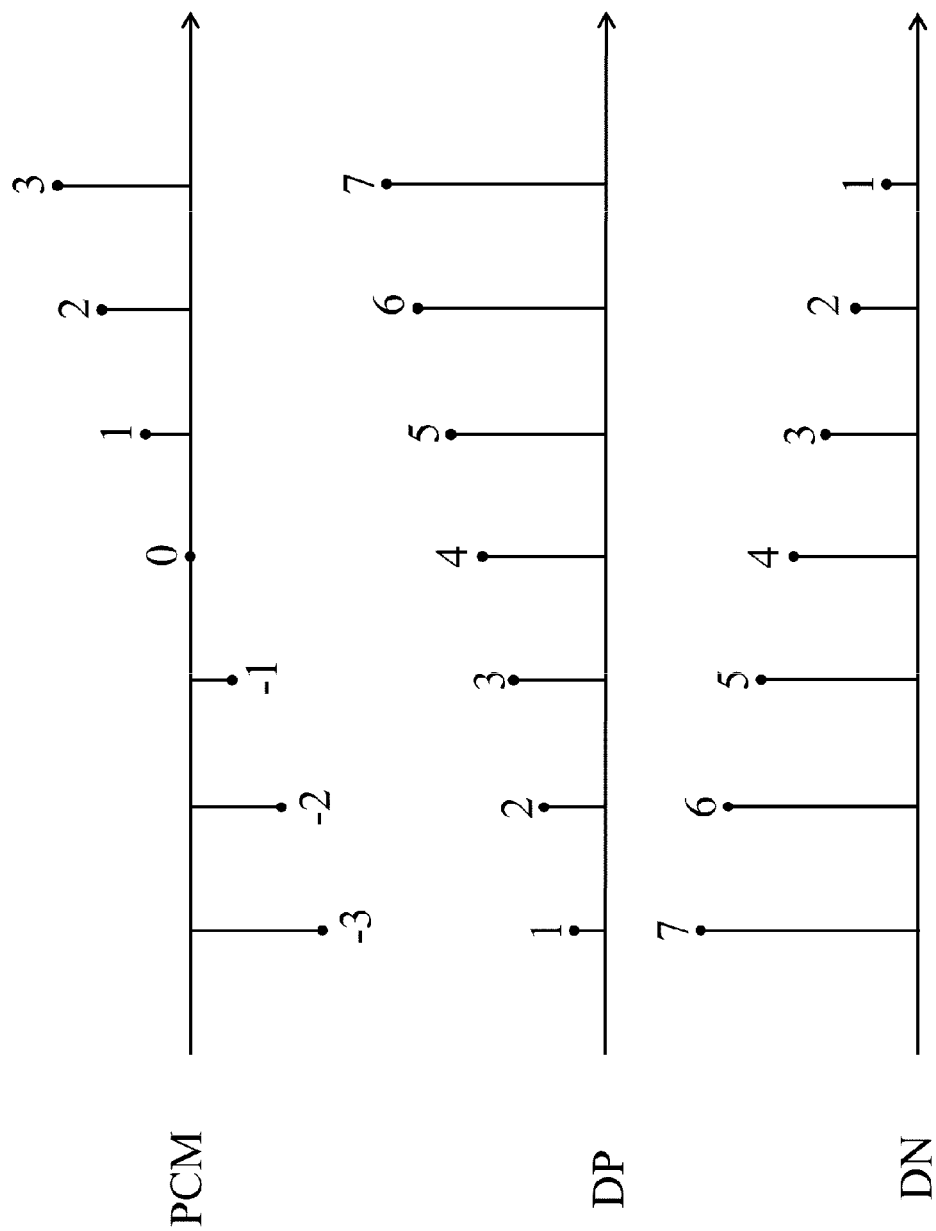
FIG. 3 shows a simplified timing diagram of audio signals generated by the audio signal processing circuit in FIG. 2 according to one embodiment of the present disclosure.
Figure 4:
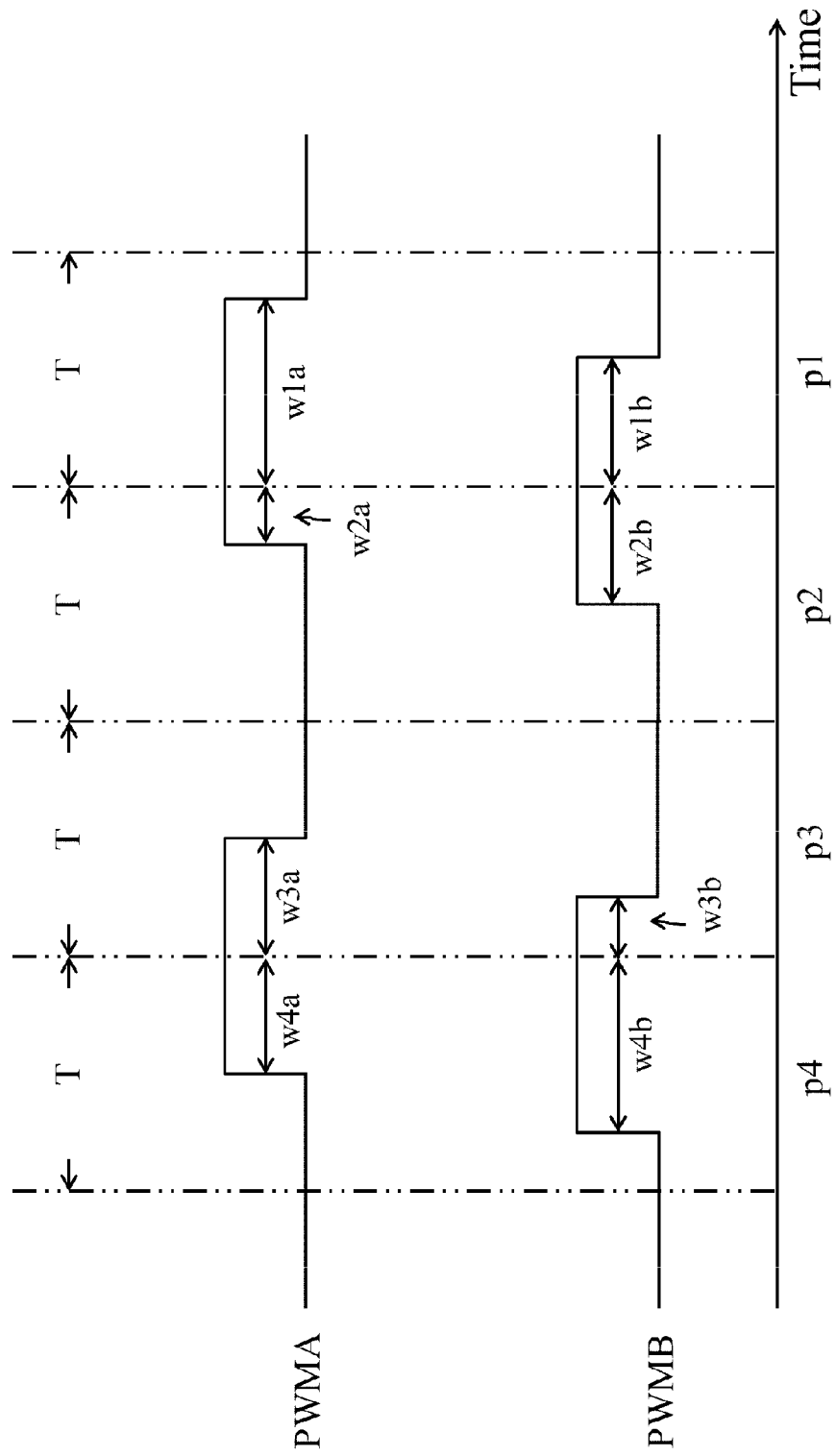
FIG. 4 shows a simplified timing diagram of PWM signals generated by the audio signal processing circuit in FIG. 2 according to one embodiment of the present disclosure.

FIG. 3 shows a simplified timing diagram of the PCM signal Ain received by the audio signal processing circuit 200 and the corresponding audio signals DP and DN according to one embodiment of the present disclosure. FIG. 4 shows a simplified timing diagram of the first PWM signal PWMA and the second PWM signal PWMB generated by the audio signal processing circuit 200 according to one embodiment of the present disclosure. The operations of the audio signal processing circuit 200 are further explained below by reference to FIGS. 2~4.

In the embodiment in FIG. 3, a 3-bit PCM signal Ain is utilized as an example for explaining the operations of the audio signal processing circuit 200. When the signal values of the PCM signal Ain received by the encoding circuit 210 are respectively from −3 to 3, the encoding circuit 210 generates the corresponding first audio signal DP respectively with encoded values from 1 to 7 and the corresponding second audio signal DN respectively with encoded values from 7 to 1 according to the PCM signal Ain. In this embodiment, when an absolute value of the PCM signal Ain is larger, a difference between the signal value of the first audio signal DP and the signal value of the second audio signal DN is larger. When the absolute value of the PCM signal Ain is smaller, the difference between the signal value of the first audio signal DP and the signal value of the second audio signal DN is smaller. The encoding circuit 210 transmits the audio signals DP and DN respectively to the audio conversion circuits 220 and 230.

The first audio conversion circuit 220 receives the first audio signal DP transmitted from the encoding circuit 210. The PWM generating circuits 222 and 224 are utilized to generate the corresponding first PWM signal PWMA respectively according to the odd encoded values and the even encoded values of the first audio signal DP, and configure a pulse width of the first PWM signal PWMA according to the encoded value of the first audio signal DP. For example, in the embodiment of FIG. 4, the first audio conversion circuit 220 receives the $1^{st}$–$4^{th}$ encoded values S1a, S2a, S3a and S4a of the first audio signal DP transmitted from the encoding circuit 210. The first PWM generating circuit 222 generates the corresponding PWM signal PWMA according to the odd encoded values S1a and S3a of the first audio signal DP, and the second PWM generating circuit 224 generates the corresponding PWM signal PWMA according to the even encoded values S2a and S4a of the first audio signal DP.

In the period p1 in FIG. 4, the first PWM generating circuit 222 generates the first PWM signal PWMA with a pulse width w1a in the latter part of the period p1 according to the encoded value of the first audio signal DP. In the period p1 which has a duration of T second, according to the encoded value S1a of the first audio signal DP, the first PWM generating circuit 222 configures the first PWM signal PWMA to be in the low voltage level for (T–w1a) second, and then configures the first PWM signal PWMA to be in the high voltage level for w1a second. In this embodiment, the duration of w1a is positively correlated with the encoded value S1a of the first audio signal DP.

In the period p2 in FIG. 4, the second PWM generating circuit 224 generates the first PWM signal PWMA with a pulse width w2a in the former part of the period p2 according to the encoded value of the first audio signal DP. In the period p2 which has a duration of T second, according to the encoded value S2a of the first audio signal DP, the second PWM generating circuit 224 configures the first PWM signal PWMA to be in the high voltage level for w2a second, and then configures the first PWM signal PWMA to be in the low voltage level for (T–w2a) second. In this embodiment, the duration of w2a is positively correlated with the encoded value S2a of the first audio signal DP.

Accordingly, in the periods p1 and p2, the first PWM signal PWMA generated by the PWM generating circuits 222 and 224 is a consecutive high-voltage-level pulse. The pulse width of the high-voltage-level pulse is (w1a+w2a) second, and the duration of (w1a+w2a) is positively correlated with the value of (S1a+S2a). Moreover, there are a (T–w1a) second and a (T–w2a) second of low-voltage-level durations locate respectively before and after the high-voltage-level pulse.

Similarly, in the periods p3 and p4, the PWM generating circuits 222 and 224 respectively generate the first PWM signal PWMA with a pulse width w3a and a pulse width w4a according to the consecutive encoded values S3a and S4a of the first audio signal DP to generate a consecutive high-voltage-level pulse. The pulse width of the high-voltage-level pulse is (w3a+w4a) second, and the duration of (w3a+w4a) is positively correlated with the value of (S3a+S4a). There are a (T–w3a) second and a (T–w4a) second of low-voltage-level durations locate respectively before and after the high-voltage-level pulse.

The second audio conversion circuit 230 receives the second audio signal DN transmitted from the encoding circuit 210. The odd encoded values and the even encoded values of the second audio signal DN are respectively transmitted to the PWM generating circuits 232 and 234 through the adder circuits 236 and 238 to generate the corresponding second PWM signal PWMB. The encoded values of the second audio signal DN are utilized to configure the pulse width of the second PWM signal PWMB. For example, in the embodiment of FIG. 4, the second audio conversion circuit 230 receives the $1^{st}$–$4^{th}$ encoded values S1b, S2b, S3b and S4b of the second audio signal DN transmitted from the encoding circuit 210.

The first adder circuit 236 subtracts the displacement value ds from the odd encoded values S1b and S3b of the second audio signal DN, and the third PWM generating circuit 232 generates the corresponding second PWM signal PWMB according to the output values of the first adder circuit 236. The second adder circuit 238 adds the displacement value ds to the even encoded values S2b and S4b of the second audio signal DN, and the fourth PWM generating circuit 234 generates the second PWM signal PWMB according to the output values of the second adder circuit 238.

In the period p1 in FIG. 4, the third PWM generating circuit 232 generates the second PWM signal PWMB with a pulse width w1b in the latter part of the period p1 according to the encoded value S1b of the second audio signal DN and the displacement value ds. In the period p1 which has a duration of T second, according to the difference (S1b–ds) of the encoded value S1b of the second audio signal DN and the displacement value ds, the third PWM generating circuit 232 configures the second PWM signal PWMB to be in the low voltage level for (T–w1b) second, and then configures the second PWM signal PWMB to be in the high voltage level for w1b second. In this embodiment, the duration of w1b is positively correlated with the difference (S1b–ds) of the encoded value S1b of the second audio signal DN and the displacement value ds.

In the period p2 in FIG. 4, the fourth PWM generating circuit 234 generates the second PWM signal PWMB with a pulse width w2b in the former part of the period p2 according to the encoded value S2b of the second audio signal DN and the displacement value ds. In the period p2 which has a duration of T second, according to the sum (S2b+ds) of the encoded value S2b of the second audio signal DN and the displacement value ds, the fourth PWM generating circuit 234 configures the second PWM signal PWMB to be in the high voltage level for w2b second, and then configures the second PWM signal PWMB to be in the low voltage level for (T–w2b) second. In this embodiment, the duration of w2b is positively correlated with the sum (S2b+ds) of the encoded value S2b of the second audio signal DN and the displacement value ds.

Accordingly, in the periods p1 and p2, the second PWM signal PWMB generated by the PWM generating circuits 232 and 234 is a consecutive high-voltage-level pulse. The pulse width of the high-voltage-level pulse is (w1b+w2b) second, and the duration of (w1b+w2b) is positively correlated with the magnitude of (S1b+S2b). Moreover, there are a (T–w1b) second and a (T–w2b) second of low-voltage-level durations locate respectively before and after the high-voltage-level pulse.

In this embodiment, the relationship between (w1b+w2b) and (S1b+S2b) is substantially identical to the relationship between (w1a+w2a) and (S1a+S2a). Accordingly, when S1a is equal to S1b, and S2a is equal to S2b (i.e., S1a+S2a is equal to S1b+S2b), the PWM signals PWMA and PWMB respectively generated by the audio conversion circuits 220 and 230 respectively have the same pulse width. Moreover, the edge of the high-voltage-level pulse of the first PWM signal PWMA and the edge of the high-voltage-level pulse of the second PWM signal PWMB are separated by a predetermined time interval, and the predetermined time interval is positively correlated with the displacement value ds.

Similarly, in the periods p3 and p4, the PWM generating circuits 232 and 234 respectively generate the second PWM signal PWMB with a pulse width w3b and a pulse width w4b according to the consecutive encoded values S3b and S4b of the second audio signal DN to generate a consecutive high-voltage-level pulse. The pulse width of the high-voltage-level pulse is (w3b+w4b) second, and the duration of (w3b+w4b) is positively correlated with the value of (S3b+S4b). There are a (T−w3b) second and a (T−w4b) second of low-voltage-level durations locate respectively before and after the high-voltage-level pulse.

When the first power stage circuit 240 receives the first PWM signal PWMA transmitted from the first audio conversion circuit 220, the first PWM signal PWMA is transmitted to the control terminal of the first transistor 241. Furthermore, the first PWM signal PWMA is also transmitted to the control terminal of the second transistor 243 through the first inverting circuit 245 so that the transistors 241 and 243 are not conducted simultaneously. The output signal at the output terminal of the first power stage circuit 240 may be generated by utilizing the first PWM signal PWMA to respectively adjust the conduction status and the conduction time of the transistors 241 and 243, and filtering by the first inductor 247 and the first capacitor 249.

When the second power stage circuit 250 receives the second PWM signal PWMB transmitted from the second audio conversion circuit 230, the second PWM signal PWMB is transmitted to the control terminal of the third transistor 251. Furthermore, the second PWM signal PWMB is also transmitted to the control terminal of the fourth transistor 253 through the second inverting circuit 255 so that the transistors 251 and 253 are not conducted simultaneously. The output signal at the output terminal of the second power stage circuit 250 may be generated by utilizing the second PWM signal PWMB to respectively adjust the conduction status and the conduction time of the transistors 251 and 253, and filtering by the first inductor 257 and the first capacitor 259.

The audio output device 260 receives the output signals of the power stage circuits 240 and 250 and generates the required sound accordingly.

Figure 5:
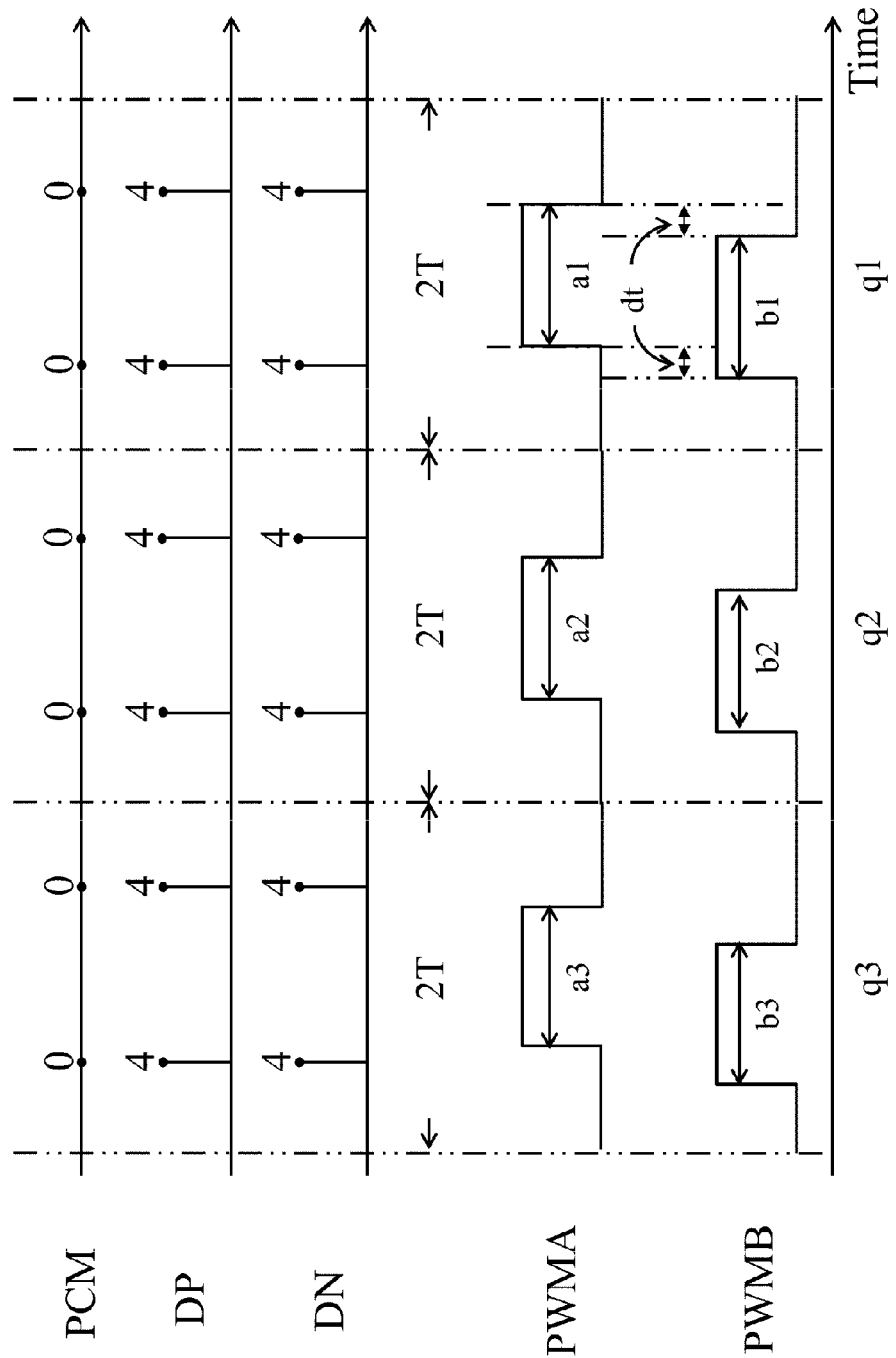
FIG. 5 shows a simplified timing diagram of PWM signals generated by the audio signal processing circuit in FIG. 2 according to another embodiment of the present disclosure.

FIG. 5 shows a simplified timing diagram of the audio signals DP and DN and the PWM signals PWMA and PWMB generated by the audio signal processing circuit 200 according to the PCM signal Ain according to another embodiment of the present disclosure. The problem caused by the zero crossing distortion problem is more severe when the audio system is configured to generate a small sound or to be mute. The embodiment in FIG. 5 is utilized to illustrate how the audio signal processing circuit 200 reduces the influence caused by the zero crossing distortion.

In the embodiment in FIG. 5, each of the values of the PCM signal Ain is configured to be 0 so that the audio signal processing circuit 200 should be mute. In this situation, the encoding circuit 210 generates the audio signals DP and DN of the same encoded value. In the embodiment of FIG. 5, each of the encoded values of the audio signals DP and DN is configured to be 4. In the period q1, the first audio conversion circuit 220 generates the first PWM signal PWMA with a pulse width a1 second according to two consecutive encoded values of the first audio signal DP, and the second audio conversion circuit 230 generates the second PWM signal PWMB with a pulse width b1 second according to two consecutive encoded values of the second audio signal DN. Because the two consecutive encoded values of the first audio signal DP and the two consecutive encoded values of the second audio signal DN are the same, the pulse width a1 second of the first PWM signal PWMA is substantially equal to the pulse width b1 second of the second PWM signal PWMB. Moreover, the edge of the high-voltage-level pulse of the first PWM signal PWMA and the edge of the pulse of the high-voltage-level pulse of the second PWM signal PWMB are separated by a time interval dt second according to the displacement value ds utilized in the second audio conversion circuit 230. Accordingly, when the audio signal processing circuit 200 is mute, other circuits in the audio signal processing circuit 200 do not generate noise because the edge of the high-voltage-level pulse of the first PWM signal PWMA and the edge of the high-voltage-level pulse of the second PWM signal PWMB are not configured to be close when the audio system is mute. Similarly, in the periods q2 and q3, the audio conversion circuits 220 and 230 may respectively generate high-voltage-level pulses separated by the predetermined time interval dt second. Consequently, other circuits in the audio signal processing circuit 200 do not generate noise because the edge of the high-voltage-level pulse of the first PWM signal PWMA and the edge of the high-voltage-level pulse of the second PWM signal PWMB are not configured to be close when the audio system is mute.

On the other hand, when the difference between the encoded value of the first audio signal DP and the encoded value of the second audio signal DN is close to or equal to the displacement value ds utilized in the second audio conversion circuit 230, the edges of the high-voltage-level pulses of the PWM signals PWMA and PWMB are very close. When the encoded value of the first audio signal DP and the encoded value of the second audio signal DN have a difference, it means that the audio signal processing circuit 200 is configured to generate sounds. Consequently, the noise caused by the zero crossing distortion problem is less perceivable by the users and the influence caused by the zero crossing distortion problem may be reduced. Therefore, the displacement value ds may be suitably configured according to the encoding rule of the encoding circuit 210 so that the noise caused by the zero crossing distortion problem occurs when the audio signal processing circuit 200 generates louder sounds. The noise is therefore not easily perceivable by the users and the influence caused by the zero crossing distortion problem may be reduced.

In the aforementioned embodiments, the PCM signal Ain is utilized as the input signal of the audio signal processing circuit 200. In other embodiments, the audio signal processing circuit 200 may adopt audio signals of any suitable format and realized with the corresponding encoding circuit.

In the aforementioned embodiments, the PWM generating circuits 222, 224, 232 and 234 may be respectively realized with analog circuits and/or digital circuits. For example, the PWM generating circuits 222 and 232 may be realized with comparison circuits for comparing the odd encoded values of the first audio signal DP with a periodic signal (e.g., a sawtooth wave signal or a triangular wave signal) and for comparing the difference of the odd encoded values of the second audio signal DN and the displacement value ds with the periodic signal to generate the required pulse width at the latter part of a suitable duration. The PWM generating circuits 224 and 234 may also compare the even encoded values of the first audio signal DP with a periodic signal and compare the sum of the even encoded values of the second audio signal DN and the displacement value ds with the periodic signal to generate the required pulse width in the former part of a suitable duration. In another embodiment, the PWM generating circuits 222, 224, 232 and 234 may be realized with digital signal processors, microprocessors, etc. for generating the required PWM signals PWMA and PWMB according to the encoded values of the first audio signal DP, the encoded values of the second audio signal DN, and the displacement value ds.

In the aforementioned embodiments, the audio signal processing circuit 200 comprises four PWM generating circuits 222, 224, 232 and 234, and two adder circuits 236 and 238. The number of the components and the relative connections are only used for explanation, and not meant to restrict the claims. For example, in other embodiments, the function of the PWM generating circuits 222 and 224 may be realized with one comparison circuit. In other embodiments, the four PWM generating circuits 222, 224, 232 and 234 may also be realized with one comparison circuit, and the adder circuits 236 and 238 may be realized with one adder circuit. In other embodiments, the PWM generating circuits 222, 224, 232 and 234 and the adder circuits 236 and 238 may be realized with one or more microprocessors or digital signal processors.

In the aforementioned embodiments, the displacement value ds is configured to be a positive number. In other embodiments, the displacement value ds may be configured to be a negative number. In other embodiments, the adder circuits 236 and 238 may be respectively realized with an adder circuit structure or a subtraction circuit structure according to the displacement value ds. For example, in another embodiment, the second audio conversion circuit 230 utilizes the first adder circuit 236 to add the displacement value ds to the odd encoded values of the second audio signal DN, and utilizes the second adder circuit 238 to subtract the displacement value from the odd encoded values of the second audio signal DN.

In the aforementioned embodiments, the first audio conversion circuit 220 is configured to generate a high-voltage-level pulse according to two consecutive encoded values of the first audio signal DP, and the second audio conversion circuit 230 is configured to generate a high-voltage-level pulse according to two consecutive encoded values of the second audio signal DN and the displacement value ds. The utilization of the odd encoded values and the even encoded values is only one of the possible embodiments. In another embodiment, the second audio conversion circuit 230 may also utilize the first adder circuit 236 to subtract the displacement value ds from the odd encoded values of the second audio signal DN, and utilize the second adder circuit 238 to add the displacement value ds to the even encoded values of the second audio signal DN. Moreover, in other embodiments, the audio conversion circuits 220 and 230 may also be configured to generate a high-voltage-level pulse according to more consecutive encoded values of the audio signals DP and DN. For example, the first audio conversion circuit 220 may be configured to generate a high-voltage-level pulse according to three consecutive encoded values of the first audio signal DP.

In the aforementioned embodiments, the second audio conversion circuit 230 generates the second PWM signal PWMB according to the second audio signal DN and the displacement value ds. In other embodiments, the first audio conversion circuit 220 may also be configured to generate the first PWM signal PWMA according to the first audio signal DP and the displacement value ds. In another embodiment, the audio conversion circuits 220 and 230 may respectively generate the PWM signals PWMA and PWMB according to the first audio signal DP and a first displacement value, and according to the second audio signal DN and a second displacement value. Moreover, the first displacement value and the second displacement value may be configured to be the same or different.

In other embodiments, the encoding circuit 210 may comprise the function of the adder circuits 236 and 238 for generating the sum of the second audio signal DN and the displacement value ds and the difference of the second audio signal DN and the displacement value ds. Therefore, the adder circuits 236 and 238 in the second audio conversion circuit 230 may be omitted.

In the aforementioned embodiments, every functional block may be respectively realized with multiple circuit components, and multiple functional blocks may also be integrated in a single circuit component. For example, in one embodiment, the audio conversion circuits 220 and 230 may be configured in the same integrated circuit element, and the power stage circuits 240 and 250 may be realized with discrete circuit components. In another embodiment, the audio conversion circuits 220 and 230 and the power stage circuits 240 and 250 may be configured in the same integrated circuit element.

In the aforementioned embodiments, when the audio signal processing circuit 200 is configured to generate a small sound or to be mute, the influence caused by the zero crossing distortion may still be reduced without arranging the delay circuits between the first audio conversion circuit 220 and the first power stage circuit 240 and between the second audio conversion circuit 230 and the second power stage circuit 250. In another embodiment, one or more delay circuits may be configured between the first audio conversion circuit 220 and the first power stage circuit 240 and/or between the second audio conversion circuit 230 and the second power stage circuit 250 according to different design considerations.

In the aforementioned embodiments, the encoded values of the audio signal are positively correlated with the pulse width of the PWM signal, and the predetermined time interval between the edges of the high-voltage-level pulses is positively correlated with the displacement value ds. For example, in one embodiment, the predetermined time interval is directly proportional to the displacement value ds. Namely, when the displacement value is larger, the predetermined time interval is larger. In other embodiments, the encoded value of the audio signal may be configured to be negatively correlated with the pulse width of the PWM signal, and/or the predetermined time interval may be configured to be negatively correlated with the displacement value ds. For example, in another embodiment, the predetermined time interval is inversely proportional to the displacement value ds. Namely, when the displacement value is larger, the predetermined time interval is smaller.

In the aforementioned embodiments, the signals are expressed as active high signals. In other embodiments, each of the signals may be respectively realized with active high signals or active low signals according to different design considerations.

In the aforementioned embodiments, when the audio signal processing circuit 200 is configured to generate a small sound or to be mute, the audio conversion circuits 220 and 230 may configure the edge of the pulse of the first PWM signal PWMA and the edge of the pulse of the second PWM signal PWMB to be separated by an appropriate time interval. Thus, the noise caused by the zero crossing distortion problem may be reduced.

Moreover, the audio signal processing circuit 200 may configure the edge of the pulse of the first PWM signal PWMA and the edge of the pulse of the second PWM signal PWMB to be separated by an appropriate time interval by adding the displacement value ds to the encoded value of the audio signal or subtracting the displacement value ds from the encoded value of the audio signal. The implementation is very simple and the separated time interval may be accurately configured. Therefore, the noise and the inaccuracy of the separated time interval caused by the delay circuits may be reduced.

In the aforementioned embodiments, the audio signal processing circuit 200 may be configured to generate the PWM signals PWMA and PWMB according to the encoded values of multiple audio signals. Accordingly, switching frequency of the power stage circuits 240 and 250 may be reduced and the requirement of hardware design may be reduced.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. An audio signal processing circuit, configured to operably configure an audio output device through a first power stage circuit and a second power stage circuit, comprising:
    an encoding circuit, configured to operably receive a pulse coded modulation signal and to operably generate a first audio signal and a second audio signal according to the pulse coded modulation signal;
    a first audio conversion circuit, coupled with the encoding circuit, configured to operably generate a first pulse width modulation (PWM) signal to configure the first power stage circuit according to a first encoded value and a second encoded value of the first audio signal; and
    a second audio conversion circuit, coupled with the encoding circuit, configured to operably generate a second PWM signal to configure the second power stage circuit according to a third encoded value of the second audio signal, a fourth encoded value of the second audio signal and a displacement value;
    wherein the first encoded value and the second encoded value are consecutive in the first audio signal; the third encoded value, the fourth encoded value are consecutive in the second audio signal; when the first encoded value is equal to the third encoded value, and the second encoded value is equal to the fourth encoded value, a pulse width of a pulse of the first PWM signal is equal to a pulse width of a pulse of the second PWM signal, and an edge of the pulse of the first PWM signal and an edge of the pulse of the second PWM signal is separated by a predetermined time interval;
    wherein the second audio conversion circuit generates a first part of the pulse of the second PWM signal according to a difference of the third encoded value and the displacement value, and generates a second part of the pulse of the second PWM signal according to a sum of the fourth encoded value and the displacement value.

2. The audio signal processing circuit of claim 1, wherein the second audio conversion circuit further comprising:
    a first adder circuit, coupled with the encoding circuit, configured to operably subtract the displacement value from the third encoded value;
    a second adder circuit, coupled with the encoding circuit, configured to operably add the displacement value to the fourth encoded value;
    a third PWM generating circuit, coupled with the first adder circuit, configured to operably generate the first part of the pulse of the second PWM signal according to the difference of the third encoded value and the displacement value; and
    a fourth PWM generating circuit, coupled with the second adder circuit, configured to operably generate the second part of the pulse of the second PWM signal according to the sum of the fourth encoded value and the displacement value.

3. The audio signal processing circuit of claim 2, wherein the first PWM signal comprises a first consecutive high-voltage-level pulse and a pulse width of the first consecutive high-voltage-level pulse is positively correlated with a sum of the first encoded value and the second encoded value; the second PWM signal comprises a second consecutive high-voltage-level pulse and a pulse width of the second consecutive high-voltage-level pulse is positively correlated with a sum of the third encoded value and the fourth encoded value.

4. The audio signal processing circuit of claim 2, wherein the predetermined time interval is positively correlated with the displacement value.

5. An audio signal processing circuit, configured to operably configure an audio output device through a first power stage circuit and a second power stage circuit, comprising:
    an encoding circuit, configured to operably receive a pulse coded modulation signal and to operably generate a first audio signal and a second audio signal according to the pulse coded modulation signal;
    a first audio conversion circuit, coupled with the encoding circuit, configured to operably generate a first pulse width modulation (PWM) signal to configure the first power stage circuit according to a first encoded value and a second encoded value of the first audio signal; and
    a second audio conversion circuit, coupled with the encoding circuit, configured to operably generate a second PWM signal to configure the second power stage circuit according to a third encoded value of the second audio signal, a fourth encoded value of the second audio signal and a displacement value;
    wherein the first encoded value and the second encoded value are consecutive in the first audio signal; the third encoded value, the fourth encoded value are consecutive in the second audio signal; when the first encoded value is equal to the third encoded value, and the second encoded value is equal to the fourth encoded value, a pulse width of a pulse of the first PWM signal is equal to a pulse width of a pulse of the second PWM signal, and an edge of the pulse of the first PWM signal and an edge of the pulse of the second PWM signal is separated by a predetermined time interval;

wherein the second audio conversion circuit generates a first part of the pulse of the second PWM signal according to a sum of the third encoded value and the displacement value, and generates a second part of the pulse of the second PWM signal according to a difference of the fourth encoded value and the displacement value.

6. The audio signal processing circuit of claim 5, wherein the second audio conversion circuit further comprising:
   a first adder circuit, coupled with the encoding circuit, configured to operably add the displacement value to the third encoded value;
   a second adder circuit, coupled with the encoding circuit, configured to operably subtract the displacement value from the fourth encoded value;
   a third PWM generating circuit, coupled with the first adder circuit, configured to operably generate the first part of the pulse of the second PWM signal according to the sum of the third encoded value and the displacement value; and
   a fourth PWM generating circuit, coupled with the second adder circuit, configured to operably generate the second part of the pulse of the second PWM signal according to the difference of the fourth encoded value and the displacement value.

7. The audio signal processing circuit of claim 5, wherein the first PWM signal comprises a first consecutive high-voltage-level pulse and a pulse width of the first consecutive high-voltage-level pulse is positively correlated with a sum of the first encoded value and the second encoded value; the second PWM signal comprises a second consecutive high-voltage-level pulse and a pulse width of the second consecutive high-voltage-level pulse is positively correlated with a sum of the third encoded value and the fourth encoded value.

8. The audio signal processing circuit of claim 5, wherein the predetermined time interval is positively correlated with the displacement value.

9. A method for processing audio signals, comprising:
   generating a first audio signal and a second audio signal according to a pulse coded modulation signal;
   generating a first PWM signal to configure a first power stage circuit according to a first encoded value and a second encoded value of the first audio signal;
   generating a second PWM signal to configure the second power stage circuit according to a third encoded value of the second audio signal, a fourth encoded value of the second audio signal and a displacement value;
   generating a first part of a pulse of the second PWM signal according to a difference of the third encoded value and the displacement value; and
   generating a second part of the pulse of the second PWM signal according to a sum of the fourth encoded value and the displacement value;
   wherein the first encoded value and the second encoded value are consecutive in the first audio signal; the third encoded value, the fourth encoded value are consecutive in the second audio signal; when the first encoded value is equal to the third encoded value, and the second encoded value is equal to the fourth encoded value, a pulse width of a pulse of the first PWM signal is equal to a pulse width of the pulse of the second PWM signal, and an edge of the pulse of the first PWM signal and an edge of the pulse of the second PWM signal is separated by a time interval.

10. The method for processing audio signals of claim 9, wherein the first PWM signal comprises a first consecutive high-voltage-level pulse and a pulse width of the first consecutive high-voltage-level pulse is positively correlated with a sum of the first encoded value and the second encoded value; the second PWM signal comprises a second consecutive high-voltage-level pulse and a pulse width of the second consecutive high-voltage-level pulse is positively correlated with a sum of the third encoded value and the fourth encoded value.

11. The method for processing audio signals of claim 9, wherein the predetermined time interval is positively correlated with the displacement value.

12. A method for processing audio signals, comprising:
   generating a first audio signal and a second audio signal according to a pulse coded modulation signal;
   generating a first PWM signal to configure a first power stage circuit according to a first encoded value and a second encoded value of the first audio signal;
   generating a second PWM signal to configure the second power stage circuit according to a third encoded value of the second audio signal, a fourth encoded value of the second audio signal and a displacement value;
   generating a first part of the second PWM signal according to the sum of the third encoded value plus the displacement value; and
   generating a second part of the second PWM signal according to the difference of the fourth encoded value minus the displacement value;
   wherein the first encoded value and the second encoded value are consecutive in the first audio signal; the third encoded value, the fourth encoded value are consecutive in the second audio signal; when the first encoded value is equal to the third encoded value, and the second encoded value is equal to the fourth encoded value, a pulse width of a pulse of the first PWM signal is equal to a pulse width of the pulse of the second PWM signal, and an edge of the pulse of the first PWM signal and an edge of the pulse of the second PWM signal is separated by a time interval.

13. The method for processing audio signals of claim 12, wherein the first PWM signal comprises a first consecutive high-voltage-level pulse and a pulse width of the first consecutive high-voltage-level pulse is positively correlated with a sum of the first encoded value and the second encoded value; the second PWM signal comprises a second consecutive high-voltage-level pulse and a pulse width of the second consecutive high-voltage-level pulse is positively correlated with a sum of the third encoded value and the fourth encoded value.

14. The method for processing audio signals of claim 12, wherein the predetermined time interval is positively correlated with the displacement value.

* * * * *